ROBERT N. MELLOTT
INVENTOR.
BY
ATTORNEY

Jan. 12, 1965 R. N. MELLOTT 3,165,636

ELECTRONIC SWITCHING CIRCUITS

Filed July 31, 1958 4 Sheets-Sheet 2

ROBERT N. MELLOTT
INVENTOR.

BY

[signature]
ATTORNEY

Jan. 12, 1965 R. N. MELLOTT 3,165,636

ELECTRONIC SWITCHING CIRCUITS

Filed July 31, 1958 4 Sheets-Sheet 3

ROBERT N. MELLOTT
INVENTOR.

BY

[signature]
ATTORNEY

BY

ATTORNEY

United States Patent Office 3,165,636
Patented Jan. 12, 1965

3,165,636
ELECTRONIC SWITCHING CIRCUITS
Robert N. Mellott, Los Angeles, Calif., assignor, by mesne assignments, to The Bunker-Ramo Corporation, Stamford, Conn., a corporation of Delaware
Filed July 31, 1958, Ser. No. 752,222
8 Claims. (Cl. 307—88.5)

This invention relates to electronic switching circuits, and more particularly, to transistorized circuits which produce bilevel output signals in response to bilevel input signals.

In a typical use of an electronic switching circuit in a digital computer, for instance, a bilevel input signal is employed to control the passage of current to a load. Transistors have been employed for this purpose and may be operated by forward biasing the transistor with a signal applied to its base to permit the passage of current through the emitter-to-collector path of the transistor to a load.

The known transistor switching circuits of this type may be limited in operating speed due to the fact that the gating (i.e., switching) transistor may be driven between saturation and cut-off. Thus, sufficient time must be allowed during each digital timing (clock pulse) period, to allow the transistors to be cut off if the gating condition is not satisfied. This action, however, is not positive and therefore time is required for a transistor which has been driven into saturation to return to a cut-off state when the gate control signal is removed.

The saturation problem is also found in the use of flip-flops or bistable multivibrators. If a transistor output stage is employed which is driven into saturation, the problem is similar to that discussed above; but, in addition, there is the further problem of the saturation of the flip-flop stabilization transistors. In the typical flip-flop, there are two aspects to the problem. One is the tendency of a saturated output transistor to remain saturated even after the flip-flop has changed its stable state, and the other is the lag in the flip-flop response to an input signal due to the saturation of a flip-flop transistor. This results in a limitation upon the operating speed.

The present invention obviates the above and other disadvantages inherent in the prior art type of switching circuits in providing what may be referred to as active cut off for all transistors employed for gating or flip-flop action. Active cut off is intended to signify the application of a back biasing signal to a transistor, rather than the mere removal of the forward biasing signal as is the conventional practice.

In the basic switching circuit of the invention, first and second transistors are employed, with each transistor being arranged to provide an active cut off for the other in response to certain input signal conditions. In terms of a specific circuit, this is accomplished by coupling the emitter of an NPN transistor to the base electrode of a PNP transistor which is provided with an output circuit at its collector load. An input signal is applied to the NPN transistor at its base, and when the transistor is driven into conduction, its emitter voltage rises and back biases the PNP transistor, thus cutting it off. In a similar manner, when the PNP transistor conducts it tends to raise the emitter potential of the NPN transistor and cut it off. Thus, only one transistor conducts at a time and positive switching action is possible, since the conduction of each transistor provides an active cut off or back biasing of the other transistor.

Accordingly, it is an object of the present invention to provide active cut-off switching operation for electronic gating circuits to permit high speed operation thereof.

Another object is to provide an output circuit for a flip-flop which is actively controlled to drive its stages into conduction and to cut off current in response to certain input signal conditions.

A further object is to provide an improved transistor switching circuit wherein first and second transistors each operate to cut off the other transistor when conducting, providing an active cut off for each transistor to accelerate the change from a saturated condition to a non-saturated condition.

In addition to the basic switching circuit provided by the invention, several other specific improvements are contemplated. An improved type of transistor input circuit is contemplated which may be employed advantageously either as a flip-flop input circuit or to drive the basic switching stage of the invention as an amplifier. It will be shown, however, that the basic switching circuit of the invention may be operated with an input circuit employing a Zener diode rather than a transistor.

It will be shown that the transistor type of input circuit may advantageously be employed to permit an extension of the gating logic. By this it is meant that several separately developed networks may be combined in an "and" function at the input terminal of a flip-flop to avoid unnecessary duplication in logic.

Another specific feature of the invention to be described is the provision of a single-input flip-flop. That is, the circuit of the invention may be modified so that a single bilevel control signal is effective to place the flip-flop in a state corresponding directly to the level of the control signal.

It will also be shown that the invention is readily adapted for use with transformer gating. In this case, the output circuits are utilized as gates to control the passage of a pulse to the primary winding of a transformer. The secondary then produces pulses which are representative of the state of the device, whether a flip-flop or gating amplifier.

A further object of the invention is to provide an improved input circuit for a flip-flop or gating amplifier which may be advantageously employed with the basic switching circuit of the invention.

Another specific object of the invention is to provide an improved type of transistor gating logic which permits simplification of input logic for a flip-flop.

A further specific object is to provide an improved type of transformer gating circuit employing transistors as gating elements which operate at high speed to cut off the conduction of any transistor, and thus permit high speed switching.

Still another object of the invention is to provide an improved input circuit for a flip-flop which permits setting the flip-flop to the desired state in response to a single input signal.

It will also be shown that the basic output circuit provided by the invention biases the flip-flop transistors so that the flip-flop will change its state when both input circuits receive actuating signals simultaneously. This means that the controlling logic for the flip-flop need not be designed to prevent triggering both input circuits simultaneously and, accordingly, permits a simplification of the input network.

Accordingly, yet another specific object of the invention is to provide a transistor flip-flop circuit which may be triggered at both input circuits to count.

The novel features which are believed to be characteristic of the invention, both as to its organization and method of operation, together with further objects and advantages thereof, will be better understood from the following description when considered in connection with the accompanying drawings. It is to be expressly understood, however, that the drawings are for the purpose of illustration and description only and are not intended as a definition of the limits of the invention.

Figures 1, 2:
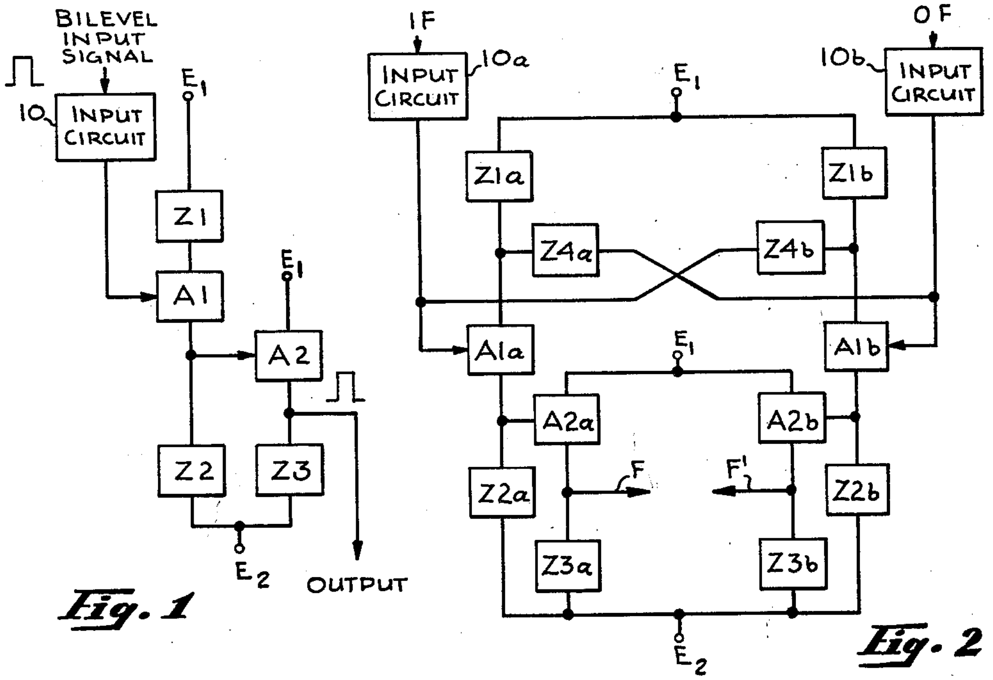
FIG. 1 is a block diagram of the basic circuit of the invention.
FIG. 2 is a block diagram of a flip-flop employing the basic circuit of the invention.
Figure 3A:
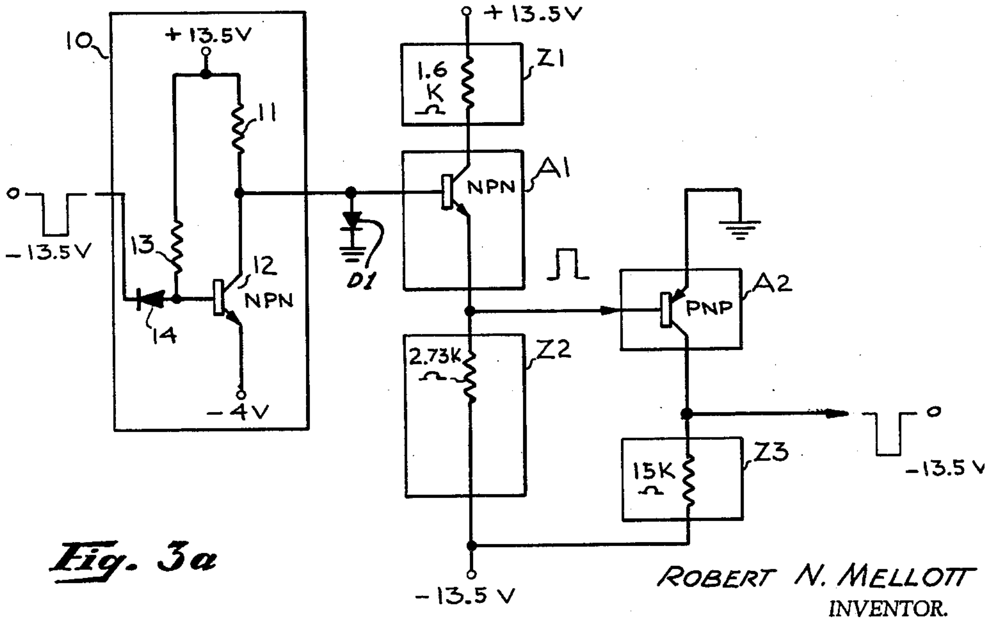
Figure 3B:
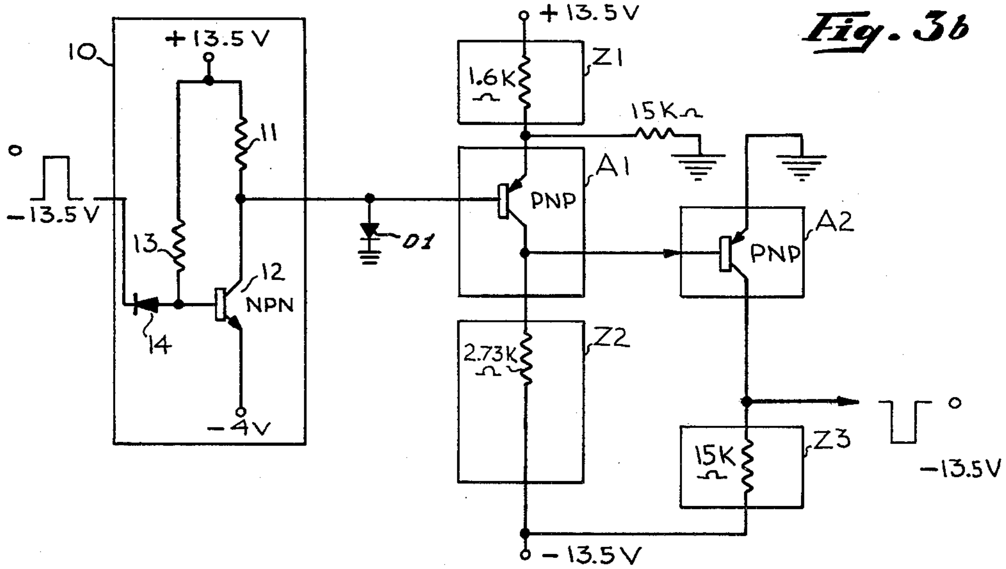
Figure 4A:
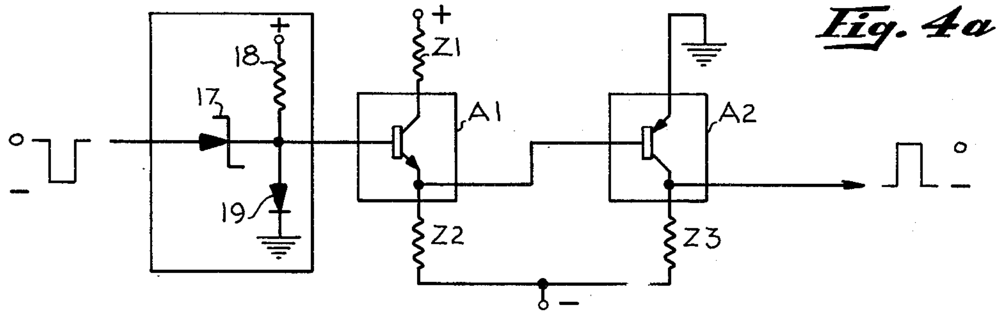
Figure 4B:
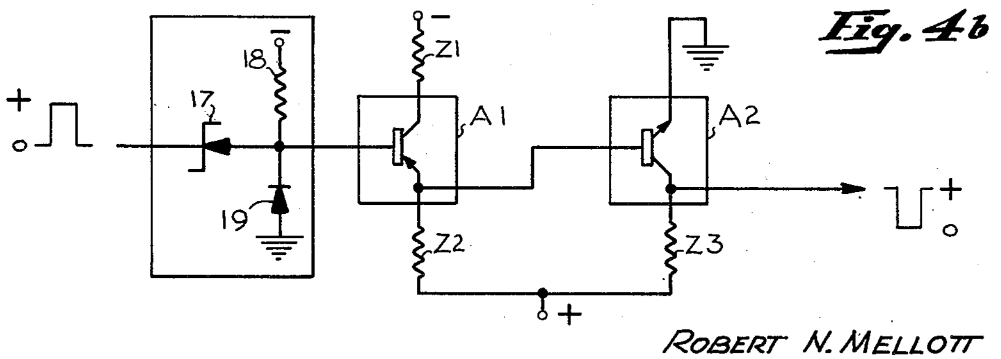
Figure 5:
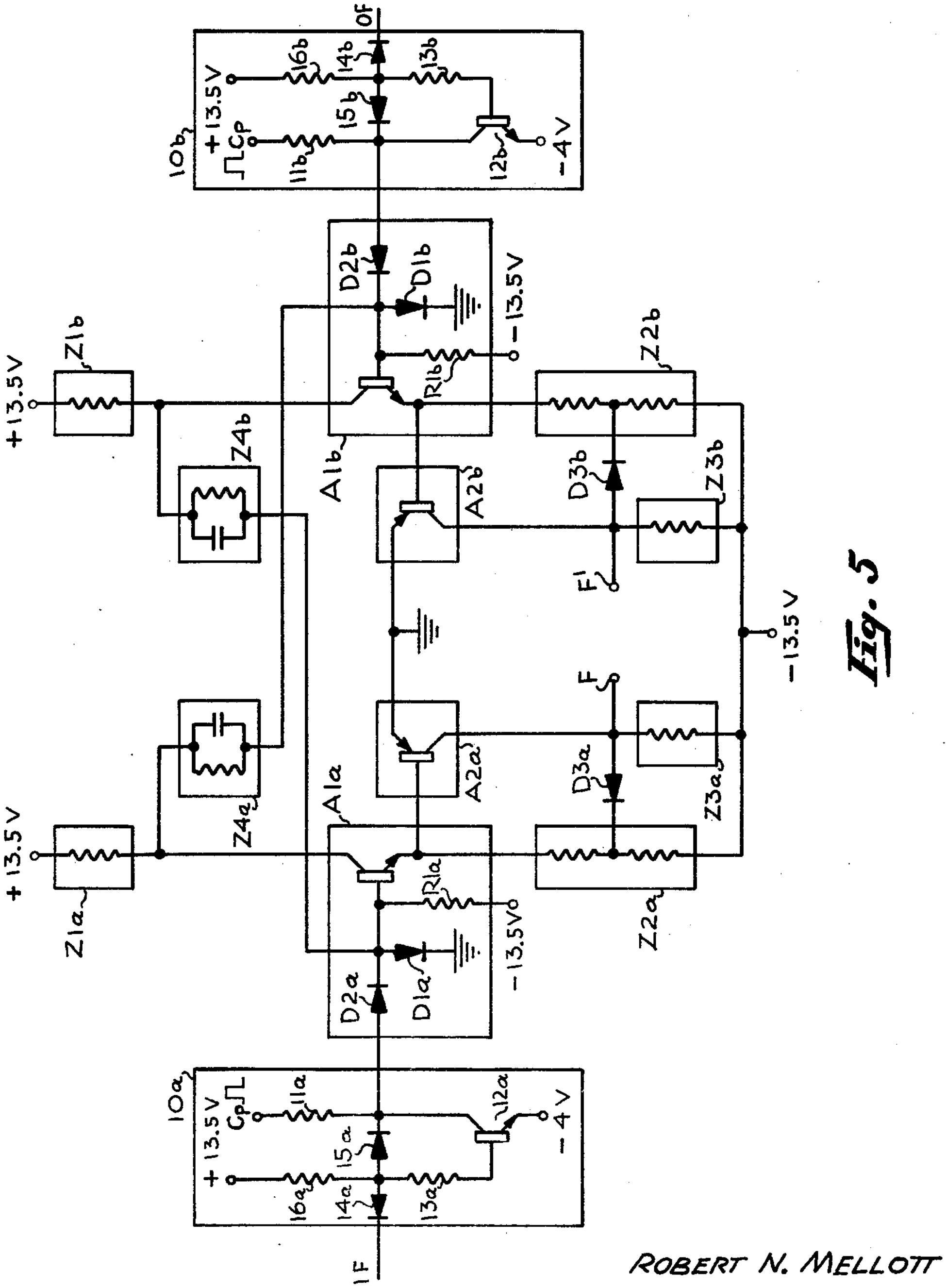
Figure 6:
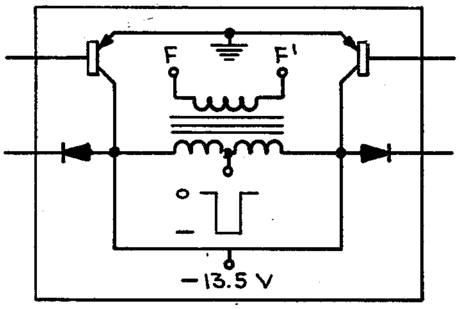
Figure 8:
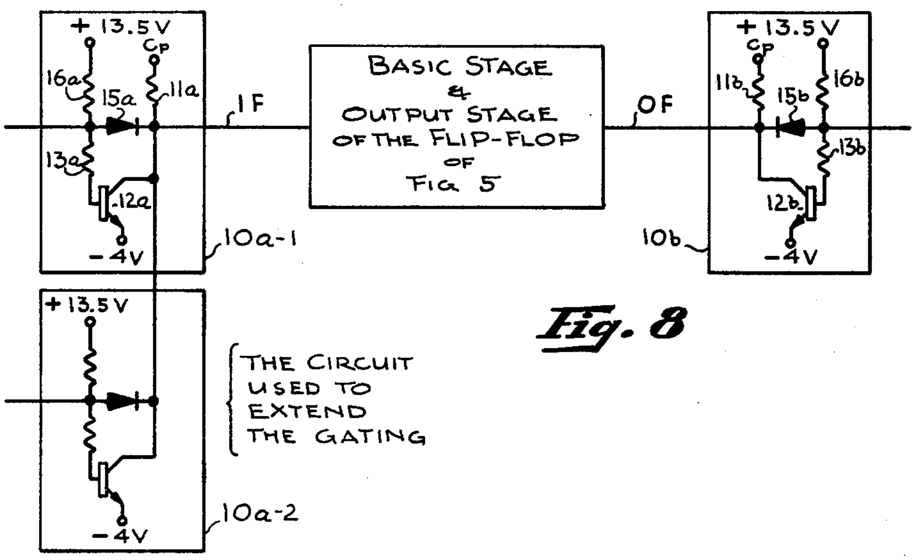
Figure 7:
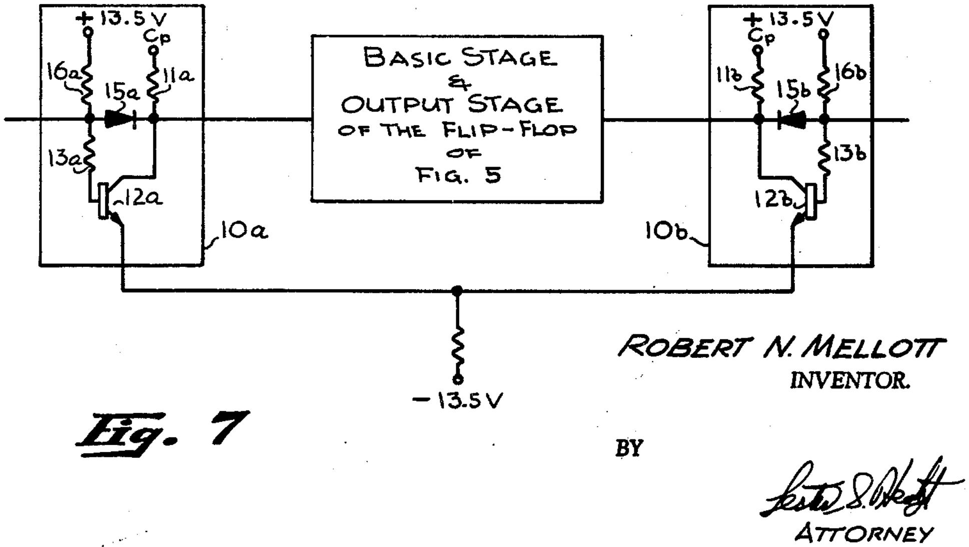

FIG. 3*a* is a schematic diagram of the basic circuit of the invention arranged to pass a non-inverted replica of an input signal;

FIG. 3*b* is a schematic diagram of the basic circuit of the invention arranged to pass an inverted replica of an input signal;

FIGS. 4*a* and 4*b* are schematic diagrams of basic circuits in which Zener diodes are used in the input circuit thereof, to provide negative and positive pulse transmission, respectively;

FIG. 5 is a schematic diagram of the flip-flop of FIG. 2;

FIG. 6 shows a variation in the output circuit of the embodiment of FIG. 5 whereby a transformer may be employed;

FIG. 7 shows a modified input circuit for the flip-flop of FIG. 5 whereby a single input signal may set the flip-flop to the desired state; and FIG. 8 shows the use of a plurality of transistors according to the invention to simplify the gating logic required to actuate a flip-flop.

Reference is now made to FIG. 1 where the basic circuit of the present invention is shown in block diagram form. As indicated, an input circuit 10 receives a bilevel input signal and produces an output signal which is applied to a first transistor amplifier A1. Amplifier A1 is biased for proper conduction by positive and negative source potentials E1 and E2 applied through impedances Z1 and Z2, respectively. The output of amplifier A1, developed across impedance Z2, controls a second transistor amplifier A2. Amplifier A2 is also connected between the source potentials and generates the circuit output across an impedance Z3. In operation, one level of input signal applied to circuit 10 is effective to forward bias amplifier A1 and to raise the signal level developed across impedance Z2 to back bias amplifier A2. The other level of the input signal causes the back biasing of amplifier A1 and lowers the potential at the input of amplifier A2 to forward bias it.

It will be understood that the potentials E1 and E2 shown in FIG. 1 do not necessarily imply a limitation to positive and negative potentials since the general embodiment shown may cover the use of active elements which are biased otherwise, such as a PNP transistor for amplifier A1 arranged with the collector coupled to a negative potential through an impedance Z1 and its emitter coupled through impedance Z2 to a positive potential. That is, the representation E may represent either a positive or a negative voltage.

The use of the basic circuit of the invention to improve the switching performance of a flip-flop is indicated in block diagram form in FIG. 2. Here two basic circuits are employed, the elements of one being referenced by the letter *a* (amplifiers **A1*a*, A2*a* and impedances Z1*a*, Z2*a* and Z3*a***) and the other being referenced by the letter *b* (amplifiers **A1*b*, A2*b*, and impedances Z1*b*, Z2*b* and Z3*b*). In addition the flip-flop includes cross-coupling impedance Z4*a* which applies the output signal of amplifier A1*a* to control the input circuit of amplifier A1*b* and cross-coupling impedance Z4*b* which applies the output signal of amplifier A1*b* to control the input circuit of amplifier A1*a*. Two input circuits 10*a* and 10*b* are shown each of which may be similar to input circuit 10 shown in FIG. 1 with appropriate modification to make the flip-flop pulse responsive, suitable circuits being described hereafter. It will be noted that the input signals for circuits 10*a* and 10*b* are designated as 1F and 0F** to represent 1-setting and 0-setting signals for the flip-flop and that the output signals are represented as F and F′ corresponding to the "on" or true state and the "off" or false state, respectively, of the flip-flop. The operation of the flip-flop circuit will be considered hereafter with reference to the specific circuit of FIG. 5.

Several specific embodiments of the invention are illustrated in other figures and will be described below. While each of these embodiments has certain specific improved aspects, the basic feature of the invention is always present as indicated in FIGS. 1 and 2, namely, that two amplifiers A1 and A2 are employed and are operated so that when amplifier A1 is conducting amplifier A2 is cut off, and when amplifier A2 is conducting amplifier A1 is cut off. This operation can best be understood by considering the specific examples of the other figures. Reference for this purpose, therefore, is now made to FIG. 3*a*.

In FIG. 3*a* is shown a schematic of a circuit according to the invention which will pass a bilevel input signal without inversion thereof. Amplifiers A1 and A2 are noted to be NPN and PNP transistors, respectively. Input to the circuit is shown as a square waveform at the levels of 0 volts and −13.5 volts.

Input circuit 10 comprises a load resistor 11 connected to the collector electrode of a transistor 12, the other end of resistor 11 being connected to a source potential of +13.5 volts, The emitter of the transistor 12 is connected to a −4 volt potential, The base of transistor 12 is connected to the +13.5 volt potential through a resistor 13, and receives the input signal through a diode 14.

The transistor A1 has its base connected to the collector of the transistor 12. The collector and emitter of the transistor A1 are respectively connected to +13.5 volts and −13.5 volts through load impedances Z1 and Z2, which are shown as resistors. The base of the transistor A2 is directly connected to the emitter of the transistor A1. The emitter electrode of transistor A2 is grounded and the collector electrode is coupled to the −13.5 volt supply through a suitable output resistor Z3.

The circuit of FIG. 3*a* operates such that, at all times, the input and output signals are at the same potential. When the input signal is above −4.0 volts (0 volts), transistor 12 is forward biased and conducts and the collector potential therefore approaches −4 volts. This back biases transistor A1 preventing the conduction of current therethrough and thus the base potential of transistor A2 drops below ground causing conduction therethrough. The base of transistor A2 cannot drop very far below ground, however, since the drop across the transistor is very small. Thus the emitter of transistor A1 is held at a point just slightly below ground and is therefore back biased by the −4 volt signal applied to the base thereof.

When the input signal falls to −13.5 volts, transistor 12 is back biased and the collector potential thereof attempts to approach +13.5 volts but, of course, is regulated near ground by diode D1. This forward biases transistor A1 since the emitter thereof was previously just below ground and causes conduction through impedance Z2 developing an output signal which back biases transistor A2. This cuts off conduction through transistor A2 so that the output signal drops from near 0 volts to −13.5 volts. Thus, the action of the circuit of FIG. 3*a* is to provide pulse gating without inversion. It will be noted in the operation of the circuit of FIG. 3*a* that both transistors A1 and A2 are actively cut off after they have been conducting. When transistor A2 is conducting and the input pulse changes, the conduction of transistor A1 causes the back biasing of transistor A2 and cuts it off sharply. In a similar manner when transistor A1 is conducting and the input signal rises to 0 volts applied to circuit 10, a back biasing signal is applied to the base of transistor A1 and, in addition, the conduction of current by transistor A2 provides a further cut-off signal developed at the emitter of transistor A1. Thus, the action of the circuit is positive both in driving the transistors into conduction and in cutting off of conduction and, therefore, permits the operation of the circuit at high switching speeds.

FIG. 3*b* shows the use of a PNP transistor for amplifier A1 rather than an NPN transistor. This permits the inversion of the input signal. That is, as indicated in FIG. 3*b*, an input signal variation from −13.5 volts to 0 volts causes an output signal variation from 0 volts to −13.5 volts. Input circuit 10 in FIG. 3*b* is the same as in FIG. 3*a*. Load impedances Z1 and Z2 may be the same as in FIG. 3*a*.

The only other modification to be noted is the addition of the 15K ohm resistor connecting impedance Z1 to ground and dividing the potential at the junction point therebetween to the desired value for the emitter of transistor A1.

In operation this circuit is similar to that of FIG. 3*a* except that the output signal variation is inverted with respect to the previous operation described. When the input signal applied to circuit 10 is at −13.5 volts transistor 12 is back biased. The voltage applied to the base electrode of transistor A1 then prevents conduction in this transistor and forward biases transistor A2, clamping the output signal level to near ground. When the input level rises to ground or zero volts, transistor 12 is forward biased. The potential applied to the base of transistor A1 falls so that it becomes forward biased and raises the potential at the base of transistor A2. This then back biases transistor A2 and cuts it off. Thus, the output signal level falls to −13.5 volts.

FIGS. 4*a* and 4*b* illustrate other variations in input circuits where Zener diodes may be employed to provide the desired driving signals for amplifier A1. In each of these cases the input signal is inverted during the switching, FIG. 4*a* showing an operation where the signals vary between zero and a negative voltage and FIG. 4*b* showing an operation where the signals vary between zero and a positive voltage. In both cases the Zener diode in input circuit 10 serves to back bias transistor A1 when it is in its voltage breakdown state. In the case of FIG. 4*a* the voltage breakdown condition of Zener diode 17 occurs when the input signal is at the negative voltage, in which case the base electrode of transistor A1 becomes negative and the transistor is back biased. When the input signal level rises to zero volts, Zener diode 17 is back biased due to a diode 19 clamping the cathode potential of diode 17 at approximately ground so that transistor A1 receives forward biasing current through resistor 18 and thus conducts and cuts off amplifier A2 causing the output signal to fall to a negative voltage. In the species of FIG. 4*b* the transistor types are changed and the Zener diode is reversed with appropriate changes in the connection of diode 19 and the source potential. In this operation, then, zero volts applied to Zener diode 17 back biases this diode and causes the forward biasing of transistor A1 and the back biasing of transistor A2 so that its collector rises to a positive voltage. When the input signal applied to the circuit of FIG. 4*b* rises to a positive voltage, Zener diode 17 breaks down and conducts so that the potential at the base electrode of transistor A1 becomes positive back biasing this transistor and causing conduction of transistor A2, so that the output signal falls to ground potential.

An important application of the switching circuits of the invention is found in the flip-flop circuit, a typical schematic arrangement according to the invention being found in FIG. 5. The arrangement of FIG. 5 employs the basic NPN-PNP transistor switching circuit previously described with reference to FIG. 3*a*, with appropriate modification being made to prevent saturation in the transistors, and introduction of a synchronizing signal referenced as *Cp* (clock pulse).

Circuits **10*a* and 10*b* are similar to input circuit 10** of FIG. 3*a* with the following modifications. Diodes **15*a* and 15*b* and resistors 16*a* and 16*b* are added to the respective input circuits to provide anti-saturation circuits for the associated transistors. In circuit 10*a*, for example, diode 15*a* is arranged to feed back a suitable amount of signal from the collector electrode of transistor 12*a*** to its base so that as current rises through this transistor the base potential is lowered. This then provides an effective regulation so that collector current is limited by the feedback potential applied to the base of the same transistor.

It will be noted that resistors **11*a* and 11*b*** each receive a positive clock pulse signal *Cp* selected so that if the respective input signal (1F or 0F) is in a low-level state (back biasing the respective input transistor), pulse *Cp* is effective to pass to the respective one of amplifiers **A1*a* and A1*b***. When the input signal is at its high level (forward biasing the respective input transistor) the clock pulse is passed through the associated input transistor to ground.

Each of amplifiers **A1*a* and A1*b* is modified to add a clamping diode D1, regulating the base signal of the respective transistor so that it cannot rise above ground and draw excessive current into the transistor. In addition a coupling diode D2** is included to insure that only positive pulses *Cp* pass through and a resistor R1 is coupled to the base of the associated transistor and to a source of negative potential to establish a suitable cut-off potential.

The output circuits are modified in a manner similar to the input circuits to prevent saturation. This is accomplished, using the circuit associated with amplifier **A1*a* as an example, by employing two resistors in impedance Z2*a* and connecting an anti-saturation diode D3*a* between the collector electrode of output transistor circuit A2*a* and the junction of the two resistors constituting impedance Z2. This arrangement regulates the amount of current which may pass through amplifier A2*a*** since an increase of current provides an increased signal applied to the base of the respective transistor which tends to limit the current.

The arrangement of cross-coupling impedances **Z4*a* and Z4*b* to complete the flip-flop is conventional and requires no special attention. In operation, a low-level signal 1F causes no conduction in transistor 12*a*** and therefore a positive pulse *Cp* passes to amplifier **A1*a* to cause conduction therein and cut off transistor A2*a* to lower the level of output signal F. At the same time the cross-coupling network causes the flip-flop to stabilize in a state where amplifier A1*a* conducts and amplifier A1*b* is cut off. A low-level signal 0F has the same effect in causing a signal to be applied to amplifier A1*b***.

Another feature of the output circuit provided by the invention may be noted at this point. When any flip-flop amplifier has been cut off its associated output amplifier provides a boost in response to an input pulse so that if pulses are applied to both flip-flop amplifiers only the previously cut off flip-flop amplifier will respond. This means that the flip-flop stage may be operated as a counter without a special gating to insure triggering of the stage. In particular, if amplifier **A1*a* is cut off and stage A1*b* is conducting, a positive pulse applied to amplifier A1*a* tends to draw it into conduction and cut amplifier A2*a* off, whereas a similar pulse applied to amplifier A1*b* at this time has no effect since amplifier A1*b* is already conducting. Then as amplifier A2*a* is cut off the back-biasing signal at the emitter of amplifier A1*a* is removed further accentuating the action. In addition the cross-coupling action of the flip-flop then tends to cut amplifier A1*b* off and its associated output amplifier A2*b*** acts in a manner tending to further this cut off since it is drawn to conduction.

The output circuit of the flip-flop of FIG. 5 may be modified to permit transformer gating, such as is shown in FIG. 6. In this case it will be noted that the primary winding of a transformer has its ends coupled to the collector electrodes of transistors **A2*a* and A2*b*** and that the clock pulse is then applied to the center tap of the primary winding and is a negative-going pulse dropping from 0 to −13.5 volts. The conducting transistor, then, permits current to be drawn through the associated half of the primary winding and thus the secondary winding of the transformer produces a signal indicating the state of the flip-flop. This signal then may be utilized to control an input circuit of the type shown in FIG. 3*a* which may be associated with a flip-flop.

In FIG. 7 a variation in input circuits 10*a* and 10*b* is shown which may be employed with the basic stage and output circuit of the flip-flop shown in FIG. 5 to permit operation in response to a single input signal. Input circuit 10*a* is similar to that described above, but it will be noted that transistors 12*a* and 12*b* have a common emitter load resistor which receives −13.5 volts. The bias potentials of the circuit and the value of the common emitter load resistor are selected so that transistor 12*b* is always conducting between receipt of clock pulses and therefore back biases transistor A1*b* (FIG. 5). When the input signal 1F rises to 0 volts the current increases through the common emitter load resistor and tends to, but does not, cut off transistor 12*b*. However, a positive clock pulse applied to resistor 11*a* is effective to raise the common emitter potential sufficiently to cut off transistor 12*b* and thus cause actuating current to trigger transistor A1*b* into a conducting state. Thus, the 0-setting signal of 0 volts applied to the base of transistor 12*a* is effective at the clock pulse time to trigger the flip-flop into the 0-representing state. The operation of the circuit in response to the 1-setting input signal is similar to that described above in that transistor 12*a* is back biased and clock pulse power is then effective through diode D2*a* to trigger transistor A1*a*. In this case transistor 12*b* remains conducting so that transistor A1*b* does not receive any actuating pulse.

Input circuits 10 are also advantageously utilized to permit an extension of the input gating. This is indicated in FIG. 8 where it will be noted that the product of two logical functions may be accomplished as an input function for a flip-flop. Thus the function 1F is composed of a first "or" function $A.B+C.D$ which is combined in an effective "and" circuit utilizing two input circuits 10*a* with the function $P.Q+Z.W$. Thus, the total input function is $1F=(A.B+C.D).(P.Q+Z.W)$.

From the foregoing description it should now be apparent that the invention provides an improved switching technique whereby the gating amplifiers employed are actively driven into conduction or are cut off from conduction thereby insuring a high-speed switching operation. The invention has been illustrated in several specific forms utilizing transistors. It will be understood, of course, that other amplifiers, such as vacuum tubes, may be employed to accomplish the same purpose. It should also be understood that all combinations of types of transistors have not been shown and that the invention is not limited to use with flip-flops or amplifying gates but may find many other logical applications.

In addition to showing the basic high-speed switching concept of the invention, the above disclosure has also shown a flip-flop triggering technique which permits operation from a single input signal, and it is pointed out that the triggering technique of the invention to the use of input circuits 10 permits a simplification in logical driving networks.

Furthermore, it has been shown that the basic flip-flop stage provided by the invention may be operated as a counter without modifying the input logic to inhibit the triggering of a conducting transistor. In practice the output circuit of the invention will be found to have other advantageous features not previously mentioned. For example, the arrangement shown provides excellent isolation for the flip-flop so that rapid changes in the load condition will not tend to trigger the flip-flop at the wrong time. Furthermore, the use of a conducting output transistor establishes a very definite emitter voltage for the cut-off flip-flop transistor in the basic stage which may be known within a few tenths of a volt. This permits accurate triggering of the flip-flop and obviates the necessity of over-driving to be sure of triggering.

It is assumed that those skilled in the art will devise many other variations based upon the present disclosure and consequently the appended claims are assumed to be generic to a wide variety of types of transistors or other amplifiers employed according to the basic configurations of the invention.

I claim:

1. In a bistable multivibrator circuit comprising first and second amplifiers each having an input electrode and first and second output electrodes, a first load impedance being coupled to each of said first output electrodes and a cross-coupling impedance connecting each first output electrode of an amplifier to the input electrode of the other amplifier, an output circuit for producing complementary bivalued output signals comprising: first and second output impedances coupled to the second output electrodes of said amplifiers, respectively; third and fourth amplifiers each having an input electrode and first and second output electrodes, the input electrodes of said third and fourth amplifiers being directly connected to the second output electrodes of said first and second amplifiers, respectively; third and fourth output impedances coupled to the second output electrodes of said third and fourth amplifiers, respectively; means for applying a first potential to the first load impedances; means for applying a second potential to said first and second output impedances; and means for applying a third potential having a level intermediate the levels of said first and second potentials directly to the first output electrodes of said third and fourth amplifiers.

2. The output circuit defined in claim 1 wherein said third and fourth output impedances comprise a transformer having a primary winding with first and second ends connected to the second output electrodes of said third and fourth amplifiers, respectively, and a center tap for receiving pulses to produce output pulses across a secondary winding of said transformer corresponding to said bivalued output signal.

3. In combination: a transistor flip-flop circuit having first and second transistors connected with the base electrode of each coupled through an impedance to the collector electrode of the other, and separate load impedances coupled to the emitter electrode of each transistor; first and second input circuits for controlling the setting of said flip-flop to first and second states, respectively; and an output circuit for producing output signals representing the state of said flip-flop, said output circuit including first and second output transistors having their base electrodes directly connected to the emitter electrodes of said first and second flip-flop transistors, respectively, first and second output impedances coupled to said first and second output transistors to produce said output signals, and means for biasing said output transistors so that said first and second output transistors are cut off by the conduction state of said first and second flip-flop transistors, respectively, and said first and second output transistors are caused to conduct by the non-conduction state of said first and second flip-flop transistors, respectively.

4. The combination defined in claim 3 wherein said input circuits each include a transistor amplifier arranged to permit the forward biasing of the associated flip-flop transistor when the transistor amplifier is cut off, the forward biasing being accomplished by applying a pulse of proper polarity to the flip-flop transistor; the conducting condition of the transistor amplifier being operative to bypass applied pulses and to maintain the flip-flop transistor cut off.

5. The combination defined in claim 3 wherein said input circuits each include a Zener diode arranged to permit the forward biasing of the associated flip-flop transistor when the Zener diode is back biased, the forward biasing being accomplished by applying a pulse of proper polarity to the flip-flop transistor; the breakdown condition of the Zener diode being effective to back bias the flip-flop transistor and to bypass any applied pulses.

6. The combination defined in claim 3 wherein at least one of said input circuits comprises a series of transistor gating amplifiers arranged so that actuating pulses cannot pass to the associated flip-flop transistor unless all of the gating amplifiers are back biased, the forward biased condition of any gating amplifier serving to bypass any pulses which may be applied to the input circuit.

7. The combination defined in claim 3 wherein said input circuits include first and second gating transistors having output circuits coupled to said first and second flip-flop transistors, respectively, said first gating transistors being biased so that the application of an "on" setting signal to the base thereof cuts off conduction and permits the passage of an actuating pulse to the base of said first flip-flop transistor, setting the flip-flop to the "on" state, said gating transistors having a common biasing impedance selected so that said second gating transistor is normally conducting preventing pulses from passing to said second flip-flop transistor and when said first gating transistor is caused to conduct the application of an input pulse to said first input circuit is effective to cut off said second gating transistor causing said second flip-flop transistor to be set, placing said flip-flop in the "off" state.

8. A computer switching circuit for producing an amplified bilevel output signal in response to a bilevel input signal, said circuit comprising: a first transistor amplifier arranged to receive the bilevel input signal and to produce a first back-bias control signal for one level of the input signal and a first forward-bias control signal for the other level thereof; a second transistor amplifier coupled to said first amplifier for response to said first bias control signals and arranged to produce a second forward-bias control signal in response to the first back-bias control signal and a second back-bias control signal in response to the first forward-bias control signal; and a third transistor amplifier for producing the bilevel output signal, said third amplifier being coupled to said second amplifier so as to be back biased and forward biased by said second forward-bias and back-bias control signals, respectively, said first, second and third amplifiers include transistors of the NPN, NPN and PNP type, respectively; the emitter of said first transistor receiving a suitable negative bias and the collector thereof being coupled to the base of said second transistor, the emitter of which produces said second control signals for the base electrode of said third transistor, the emitter of said third transistor receiving ground potential with the collector having a load circuit for producing said bilevel output signal.

References Cited in the file of this patent

UNITED STATES PATENTS

| | | |
|---|---|---|
| 2,622,212 | Anderson et al. | Dec. 16, 1952 |
| 2,816,237 | Hageman | Dec. 10, 1957 |
| 2,827,574 | Schneider | Mar. 18, 1958 |
| 2,831,113 | Weller | Apr. 15, 1958 |
| 2,838,675 | Wanlass | June 10, 1958 |
| 2,846,630 | Boyle et al. | Aug. 5, 1958 |
| 2,880,330 | Linville et al. | Mar. 31, 1959 |
| 2,888,579 | Wanlass | May 26, 1959 |
| 2,901,639 | Woll | Aug. 25, 1959 |
| 2,916,636 | Wanlass | Dec. 8, 1959 |
| 2,946,898 | Jensen | July 26, 1960 |
| 2,963,648 | Baskin et al. | Dec. 6, 1960 |
| 2,965,768 | Wanlass | Dec. 20, 1960 |
| 2,973,437 | Bradley et al. | Feb. 28, 1961 |
| 2,990,478 | Scarbough | June 27, 1961 |
| 3,005,935 | Wood | Oct. 24, 1961 |